United States Patent
Somasekhar et al.

(10) Patent No.: US 6,906,973 B1
(45) Date of Patent: *Jun. 14, 2005

(54) BIT-LINE DROOP REDUCTION

(75) Inventors: Dinesh Somasekhar, Hillsboro, OR (US); Yibin Ye, Portland, OR (US); Muhammad M. Khellah, Lake Oswego, OR (US); Fabrice Paillet, Hillsboro, OR (US); Stephen H. Tang, Pleasanton, CA (US); Ali Keshavarzi, Portland, OR (US); Shih-Lien L. Lu, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/746,148

(22) Filed: Dec. 24, 2003

(51) Int. Cl.[7] ................................................ G11C 7/00
(52) U.S. Cl. ........................................ 365/203; 365/210
(58) Field of Search ................................. 365/203, 205, 365/207, 208, 210

(56) References Cited

U.S. PATENT DOCUMENTS 5,153,853 A * 10/1992 Eby et al. .............. 365/185.08
6,370,060 B2 * 4/2002 Takata et al. .......... 365/185.21

* cited by examiner

*Primary Examiner*—Son Mai
(74) *Attorney, Agent, or Firm*—Buckley, Maschoff & Talwalkar LLC

(57) ABSTRACT

Some embodiments provide pre-charge of a bit-line coupled to a memory cell to a reference voltage using a pre-charge device, discharge of the bit-line based on a value stored by the memory cell, injection during the discharge, of a first current into the bit-line using the pre-charge device, and injection, during the discharge, of a second current into a reference bit-line using a second pre-charge device. Also during the discharge, a difference is sensed between a voltage on the bit-line and a voltage on the reference bit-line.

26 Claims, 6 Drawing Sheets

BIT-LINE DROOP REDUCTION

BACKGROUND

Conventional electronic memories may be implemented by arrays of discrete memory cells. Each memory cell in an array may store a value. Many systems exist for writing a value to and reading a value from a memory cell.

FIG. 1A shows array 10 of memory cells 20, 25, 30 and 35 according to some conventional designs. In operation, a value may be written to node 21 of cell 20 by enabling write select line WSEL0 and by charging (or discharging) associated write bit-line WBL0 to the value while read select line RSEL0 and read bit-line RBL0 are high. During a read operation of cell 20, read select line RSEL0 is pulled low and read bit-line RBL0 discharges current to read select line RSEL0 through device 22. Device 22 conducts current from RBL0 to RSEL0 even if a "0" is stored at node 21 because the voltage corresponding to a stored "0" is greater than $V_{SS}$ for device 22.

FIG. 1B is a plot of a voltage on bit-line RBL0 during the read operation described above. It is assumed that read select line RSEL0 is pulled low at time $t_1$. Line $V_1$ shows the voltage on bit-line RBL0 in a case that a "1" value is stored at node 21, and line $V_0$ shows the voltage on bit-line RBL0 in a case that a "0" value is stored at node 21. Line $V_{ref}$ shows the voltage on a reference bit-line that is also discharged during the read operation. A voltage differential exists between line $V_1$ and line $V_{ref}$ and between line $V_0$ and line $V_{ref}$ during a small window between time $t_1$ and time $t_2$. Since this difference varies based on whether a "1" or a "0" is stored at node 21, the stored value may be determined based on the difference between $V_{ref}$ and the actual voltage on bit-line RBL0 at a particular time during the read operation.

Whether a "1" or a "0" is stored, the bit-line voltage decreases to $V_{CC}-V_{TH}$ before time $t_2$. If $V_{TH}$ is large enough, other devices such as device 32 of memory cell 30 may turn on and transfer current from their associated read select line (RSELn in the case of memory cell 30) to the bit-line. These contention currents may clamp the bit-line voltage at $V_{TH}$. The foregoing factors may adversely affect the development of the bit-line differential based on which the stored value is determined.

DETAILED DESCRIPTION

Figure 2:
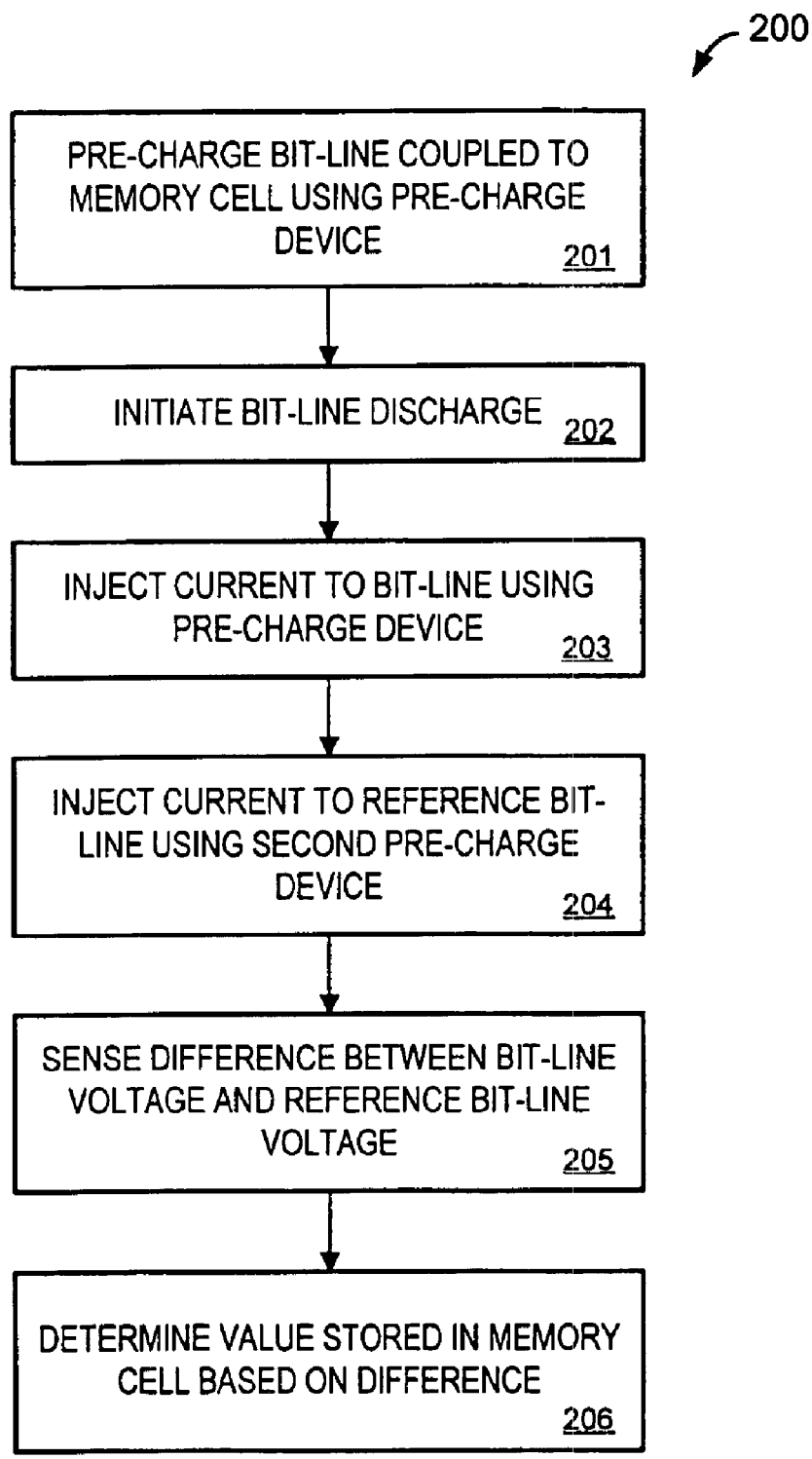
FIG. 2 is a flow diagram of a process to read a memory cell according to some embodiments.

FIG. 2 is a flow diagram of process 200 to read a memory cell according to some embodiments. Process 200 may be executed by any configuration of any elements associated with a memory cell, including any combination of hardware, software and firmware.

Briefly, process 200 includes pre-charging a bit-line coupled to a memory cell to a reference voltage using a pre-charge device, discharging the bit-line based on a value stored by the memory cell, injecting a first current into the bit-line during the discharging using the pre-charge device, injecting a second current into a reference bit-line during the discharging using a second pre-charge device, and sensing a difference between a voltage on the bit-line and a voltage on the reference bit-line during the discharging. Process 200 may thereby provide more efficient development of bit-line differential than other systems.

Figure 3:
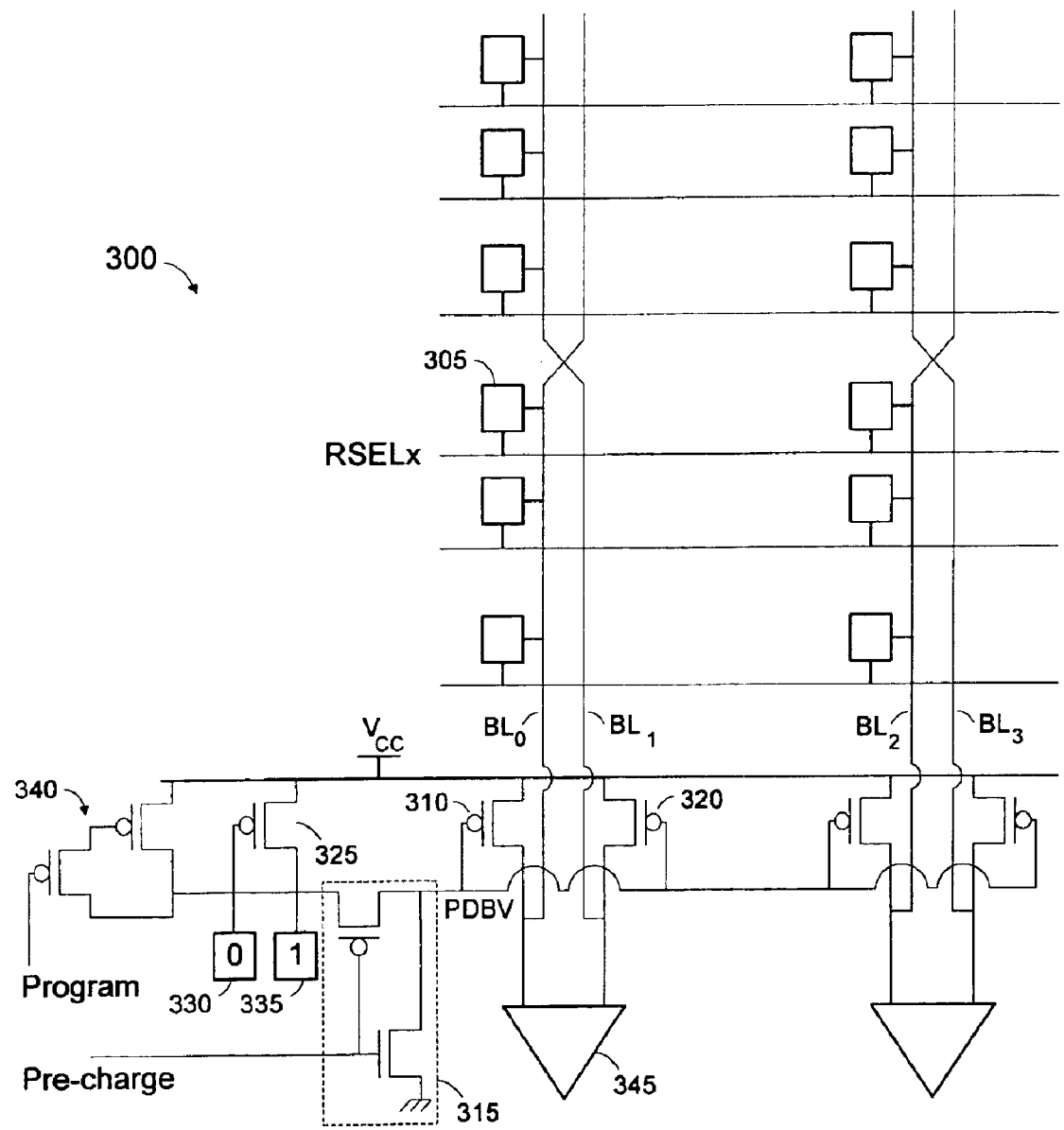
FIG. 3 is a schematic diagram illustrating a memory according to some embodiments.

FIG. 3 is a schematic diagram of apparatus 300 which will be used to describe process 200. Other systems may be used to implement process 200 according to some embodiments. Such systems may have elements in common with and/or different from the illustrated elements of apparatus 300.

Turning to process 200, a bit-line is pre-charged using a pre-charge device at 201. The bit-line is coupled to a memory cell that stores a value to be read. For example, bit-line BL0 of apparatus 300 may be pre-charged at 201 in order to read a value stored by memory cell 305. BL0 may be pre-charged by pre-charge device 310 in response to a Pre-charge signal. More particularly, the Pre-charge signal is input to inverter 315, and inverter 315 outputs a Pre-charge Device Biasing Voltage (PDBV) signal in response to the Pre-charge signal.

Figure 4:
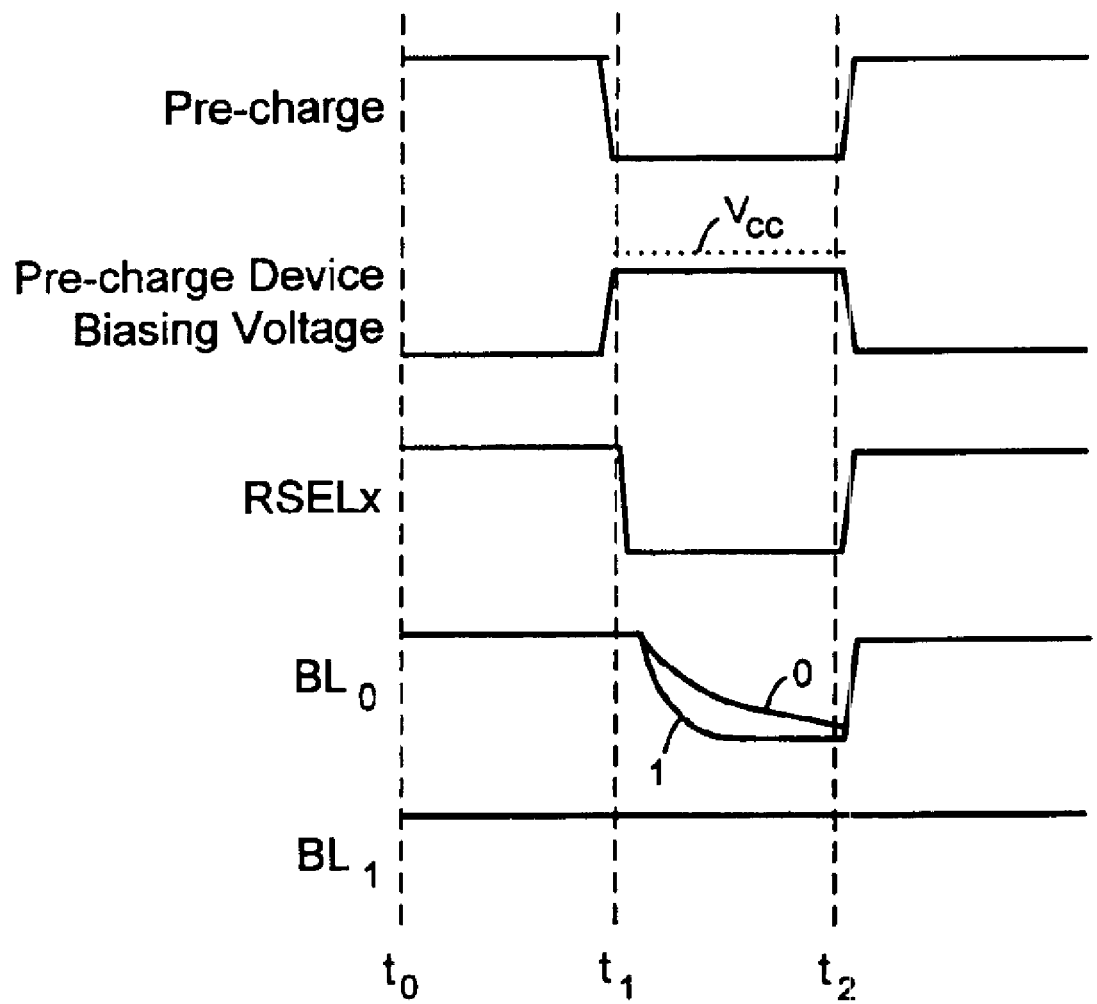
FIG. 4 is a timing diagram of memory signals during a read operation according to some embodiments.

FIG. 4 is a timing diagram of signals according to some embodiments of process 200. FIG. 4 shows the Pre-charge signal enabled at time to. Accordingly, the PDBV signal is low at time $t_0$, and pre-charge device 310, which is a p-channel metal oxide semiconductor (PMOS) device, turns on in response thereto. Bit-line BL0 is thereby coupled to supply voltage $V_{CC}$ and pre-charged to $V_{CC}$ at 201. Similarly, pre-charge device 320 receives the PDBV signal and couples bit-line BL1 to $V_{CC}$ at 201. FIG. 4 shows that the voltages of bit-lines BL0 and BL1 are both equal to $V_{CC}$ at 201 (time $t_0$).

Discharging of bit-line BL0 is initiated at 202. As mentioned above, the value stored by a memory cell may be determined by monitoring the discharge of a bit-line associated with the memory cell. In some embodiments, the Pre-charge signal is disabled and read select signal RSELx is pulled low at 202 to initiate the discharge of bit-line BL0 through memory cell 305. Pulling the read select signal RSELx low may be considered enabling the read select signal RSELx. FIG. 4 shows the Pre-charge signal being disabled just prior to time $t_1$, read select signal RSELx being pulled low at time ti, and bit-line BL0 beginning to discharge shortly thereafter. Bit-line BL1 remains at its pre-charged value because read select signal RSELx is not coupled to any memory cell to which bit-line BL1 is coupled.

Next, at 203, current is injected into bit-line BL0 during the discharging of bit-line BL0 using pre-charge device 310. The current is injected by virtue of the PDBV signal, which, as shown in FIG. 4, does not return to $V_{CC}$ when the Pre-charge signal is disabled. Accordingly, pre-charge device 310 continues to conduct current to bit-line BL0 during the discharging thereof.

The magnitude of the PDBV signal when the Pre-charge signal is disabled is controlled by diode-connected PMOS device 325 and dummy cells 330 and 335. According to some embodiments, dummy cells 330 and 335 each comprise one or more memory cells similar to memory cell 305.

Dummy cells 330 may transmit a first discharge current associated with a stored value of "0" to a gate of device 325, while dummy cells 330 may transmit a second discharge current associated with a stored value of "1" to a drain of device 325. As a result, a current based on the first and second discharge currents is mirrored through pre-charge device 310 and injected into bit-line BL0.

In some embodiments, the injected current is substantially equal to an average of the first and second discharge currents. Such a scheme may be implemented by selecting device 325 having a gate width substantially twice the gate width of device 310. Circuit 340 may be used to change the effective gate width of device 325 and to thereby change the amount of current injected at 203. For example, the Program signal may be held low to activate the devices of circuit 340 so as to change the effective gate width of device 325 and the amount of current injected into bit-line BL0. According to some embodiments, one or more circuits similar to circuit 340 are connected in parallel to circuit 340, with each circuit receiving a bit of a multi-bit Program signal. Such a system may provide fine control over the effective gate width of device 325.

Current may also be injected into bit-line BL1 during discharge of bit-line BL0 by pre-charge device 320. In this regard, pre-charge device 320 also receives the PDBV signal when the Pre-charge signal is disabled and continues to conduct current to bit-line BL1 during the discharging of bit-line BL0.

A difference between the voltage on bit-line BL0 and the voltage on bit-line BL1 is sensed at 205. Such a difference may be sensed at a time between time $t_1$ and $t_2$ where the discharge curve for a stored "1" differs from the discharge value for a stored "0". Sense amplifier 345 may be used to sense the difference at 205.

Next, at 206, a value stored by memory cell 305 is determined based on the sensed difference. The value may be determined to be a "1" if the sensed difference is greater than a threshold value and may be determined to be a "0" if the sensed difference is less than the threshold value.

Figure 1A:
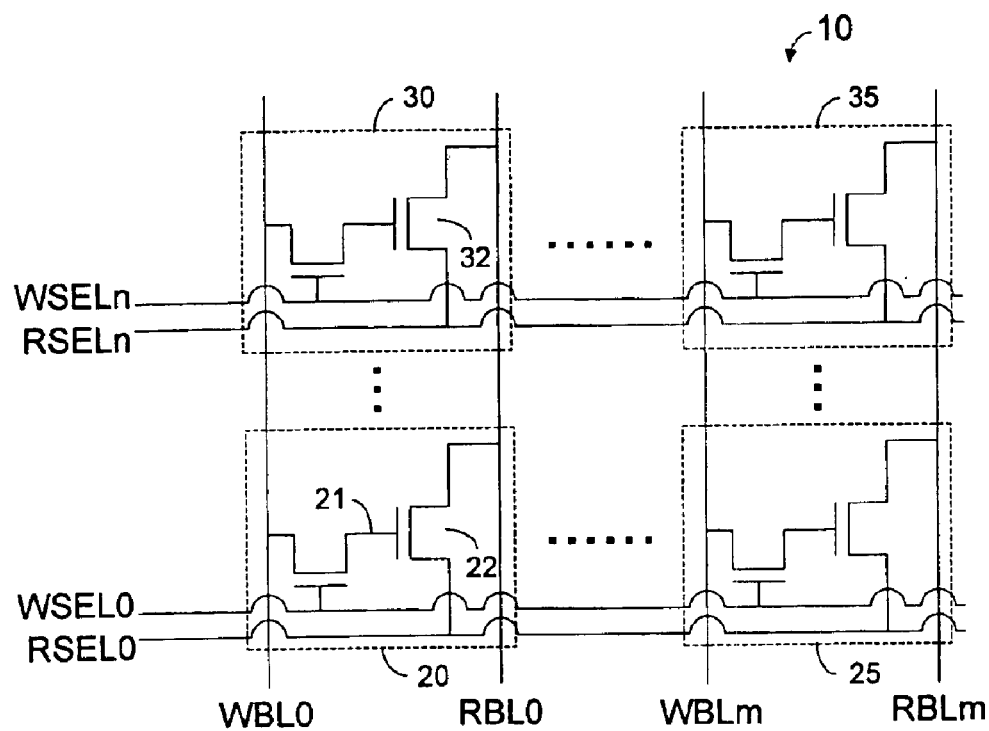
FIG. 1A is a schematic diagram illustrating a conventional memory cell array.
Figure 1B:
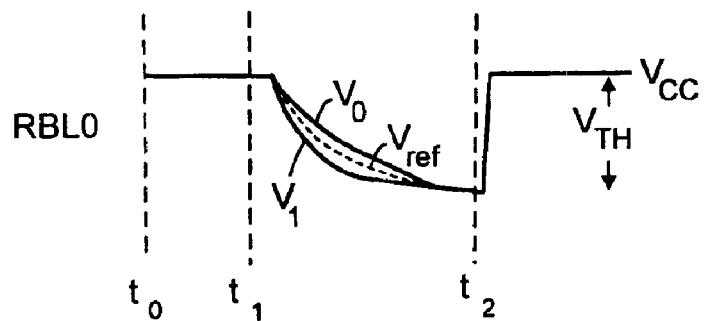
FIG. 1B is a plot of bit-line voltage vs. time during a read operation.
Figure 5:
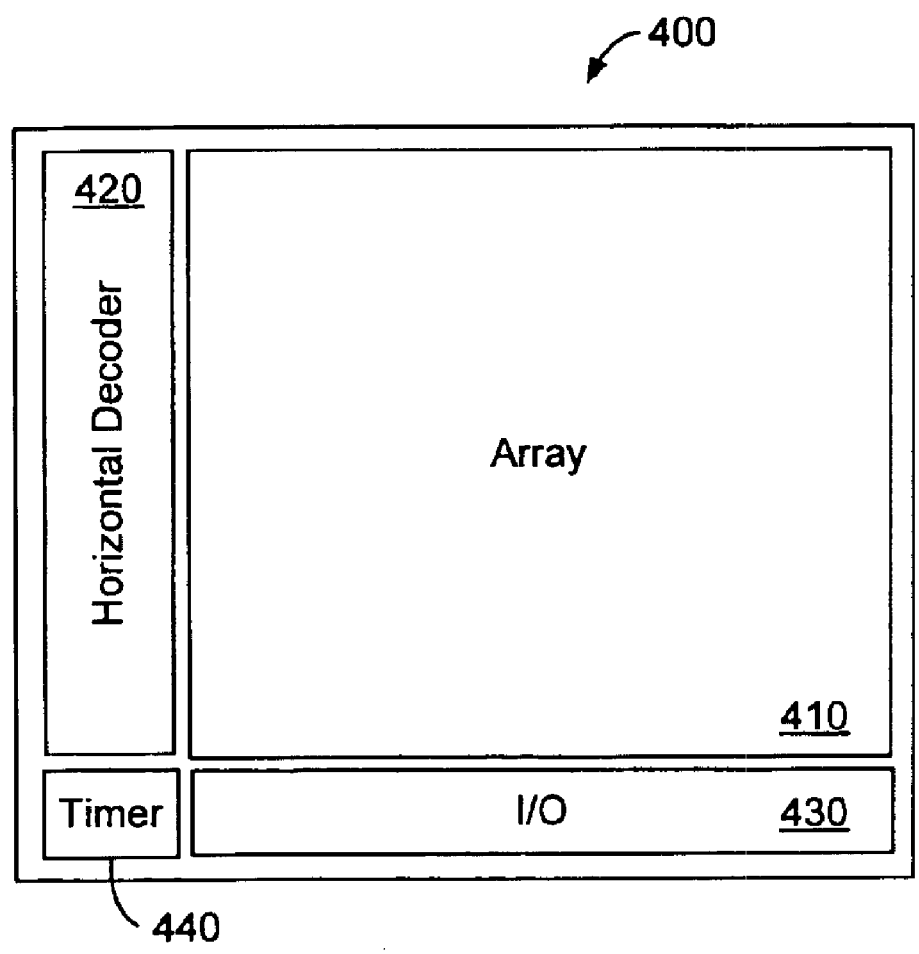
FIG. 5 is a block diagram of a memory according to some embodiments.

FIG. 5 is a block diagram of memory 400 according to some embodiments. Memory 400 includes memory array 410, horizontal decoder 420, I/O unit 430 and timer 440. Memory array 410 may include many memory cells such as those shown in FIG. 1A and FIG. 3. More particularly, a 32 kB memory block may include 256 columns of 128 memory cells each.

Horizontal decoder 420 controls the enabling and disabling of the write select and read select signal lines associated with each of the 128 rows of memory cells. I/O unit 430 may include elements 310 through 345 of FIG. 3, as well as devices to control the Pre-charge signal, and the Program signal. In this regard, timer 440 may provide suitable timing for the signals described herein.

Figure 6:
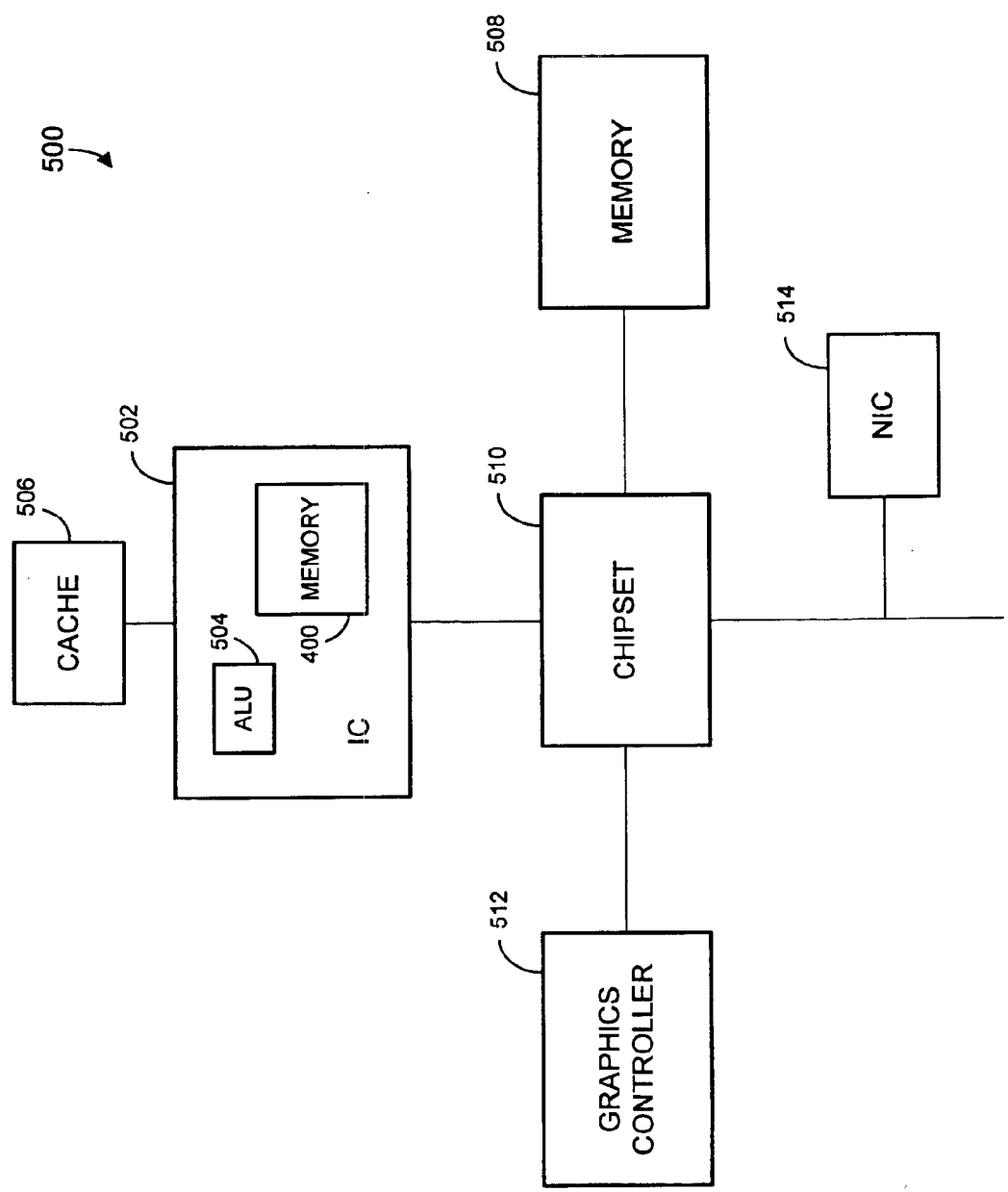
FIG. 6 is a block diagram of a system according to some embodiments.

FIG. 6 illustrates a block diagram of system 500 according to some embodiments. System 500 includes integrated circuit 502 comprising sub-blocks such as arithmetic logic unit (ALU) 504 and memory 400, which serves as an on-die cache. Integrated circuit 502 may be a microprocessor or another type of integrated circuit. Integrated circuit 502 communicates with off-die cache 506 according to some embodiments. Off-die cache 506 may also comprise a memory such as memory 400. Integrated circuit 502 may communicate with system memory 508 via a host bus and chipset 510. Other off-die functional units, such as graphics controller 512 and Network Interface Controller (NIC) 514, may communicate with integrated circuit 502 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A method comprising:
    pre-charging a bit-line coupled to a memory cell to a reference voltage using a pre-charge device;
    discharging the bit-line based on a value stored by the memory cell;
    during the discharging, injecting a first current into the bit-line using the pre-charge device;
    during the discharging, injecting a second current into a reference bit-line using a second pre-charge device; and
    during the discharging, sensing a difference between a voltage on the bit-line and a voltage on the reference bit-line.

2. A method according to claim 1, further comprising:
    determining the value stored by the memory cell based on the difference.

3. A method according to claim 1, wherein discharging the bit-line comprises:
    enabling a read select signal associated with the memory cell.

4. A method according to claim 1, wherein the first current is based on a first discharge current associated with a stored value of one and a second discharge current associated with a stored value of zero.

5. A method according to claim 4, wherein the first current is substantially equal to an average of the first discharge current and the second discharge current.

6. A method according to claim 5, wherein injecting the first current comprises:
    mirroring the first current to the bit-line using a diode-connected device that receives the first discharge current and the second discharge current.

7. A method according to claim 1, wherein injecting the first current comprises:
    biasing a gate of the first pre-charge device with a biasing voltage.

8. A method according to claim 7, wherein injecting the first current further comprises:
    generating the biasing voltage based on a first discharge current associated with a stored value of one and a second discharge current associated with a stored value of zero.

9. A circuit to:
    pre-charge a bit-line coupled to a memory cell using a pre-charge device;
    discharge the bit-line based on a value stored by the memory cell;
    during the discharge, inject a first current into the bit-line using the pre-charge device;
    during the discharge, inject a second current into a reference bit-line using a second pre-charge device; and
    during the discharge, sense a difference between a voltage on the bit-line and a voltage on the reference bit-line.

10. A circuit according to claim 9, the circuit further to:
    determine the value stored by the memory cell based on the difference.

11. A circuit according to claim 9, wherein the circuit is to discharge the bit-line by enabling a read select signal associated with the memory cell.

12. A circuit according to claim 9, wherein the first current is based on a first discharge current associated with a stored value of one and a second discharge current associated with a stored value of zero.

13. A circuit according to claim 12, wherein the first current is substantially equal to an average of the first discharge current and the second discharge current.

14. A circuit according to claim 13, the circuit to inject the first current by mirroring the first current to the bit-line using a diode-connected device that is to receive the first discharge current and the second discharge current.

15. A circuit according to claim 9, the circuit to inject the first current by biasing a gate of the first pre-charge device with a biasing voltage.

16. A circuit according to claim 15, the circuit to inject the first current by further generating the biasing voltage based on a first discharge current associated with a stored value of one and a second discharge current associated with a stored value of zero.

17. An apparatus comprising:
   a memory cell;
   a bit-line coupled to the memory cell;
   a pre-charge device coupled to the bit-line to pre-charge the bit-line to a reference voltage;
   a circuit to bias the pre-charge device during a read of the memory cell; and
   a device to receive a first discharge current associated with a stored value of one and a second discharge current associated with a stored value of zero, to generate an injection current based on the first discharge current and the second discharge current, and to mirror the injection current to the bit-line during the read of the memory cell.

18. An apparatus according to claim 17, the device further comprising:
   a reference bit-line; and
   a second pre-charge device coupled to the reference bit-line to pre-charge the reference bit-line to the reference voltage,
   the circuit to bias the second pre-charge device during the read of the memory cell.

19. An apparatus according to claim 17, wherein the injection current is substantially equal to an average of the first discharge current and the second discharge current.

20. An apparatus according to claim 17, the circuit comprising:
   a first group of one or more dummy memory cells storing a value of one, the first group to transmit the first discharge current to the device; and
   a second group of one or more dummy cells storing a value of zero, the second group to transmit the second discharge current to the device.

21. An apparatus according to claim 17, wherein a gate width of the device is substantially double a gate width of the pre-charge device.

22. An apparatus according to claim 17, the circuit further comprising:
   a second circuit coupled to the device, the second circuit to receive a control signal and to change an effective gate width of the device based on the control signal.

23. An apparatus according to claim 17, the circuit further comprising:
   a second circuit coupled to the device, the second circuit to receive a control signal and to change a value of the injection current based on the control signal.

24. A system comprising:
   a chipset; and
   a die comprising a microprocessor in communication with the chipset, wherein the microprocessor includes an apparatus comprising:
      a memory cell;
      a bit-line coupled to the memory cell;
      a pre-charge device coupled to the bit-line to pre-charge the bit-line to a reference voltage;
   a circuit to bias the pre-charge device during a read of the memory cell; and
      a device to receive a first discharge current associated with a stored value of one and a second discharge current associated with a stored value of zero, to generate an injection current based on the first discharge current and the second discharge current, and to mirror the injection current to the bit-line during the read of the memory cell.

25. A system according to claim 24, the apparatus further comprising:
   a reference bit-line; and
   a second pre-charge device coupled to the reference bit-line to pre-charge the reference bit-line to the reference voltage,
   the circuit to bias the second pre-charge device during the read of the memory cell.

26. A system according to claim 24, wherein the injection current is substantially equal to an average of the first discharge current and the second discharge current.

* * * * *